(12) United States Patent
Jung

(10) Patent No.: US 6,479,357 B1
(45) Date of Patent: Nov. 12, 2002

(54) METHOD FOR FABRICATING SEMICONDUCTOR DEVICE WITH COPPER GATE ELECTRODE

(75) Inventor: Jong-Wan Jung, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/617,275

(22) Filed: Jul. 17, 2000

(30) Foreign Application Priority Data

Feb. 29, 2000 (KR) .......................................... 2000-10091

(51) Int. Cl.[7] .............................................. H01L 21/336
(52) U.S. Cl. .......................... 438/299; 438/301; 438/303
(58) Field of Search ................................ 438/303, 687, 438/197, 299, 301, 306, 585, 589, 595

(56) References Cited

U.S. PATENT DOCUMENTS 6,251,729 B1 * 6/2001 Montree et al. ............ 438/257

FOREIGN PATENT DOCUMENTS

JP        11-87701     *  3/1999

OTHER PUBLICATIONS

Chatterjee et al., "Sub–100nm Gate Length Metal gate NMOS Transistors Fabricated by a Replacement Gate Process", Electron Devices meeting, 1997. Technical. Digest., International, pp. 821–824.*

Matsuki et al., "Cu/poly–Si Damascene Gate Structured MOSFET with Ta and TaN Stacked Barrier", Dec. 5–8, 1999, IEEE Electron Devices Meeting, pp. 261–264.*

Neudeck, Modular Series On Solid State Devices Vol. II The PN Junction Diode, 1983, Addison–Wesley, pp. 8–10.*

* cited by examiner

*Primary Examiner*—Michael Sherry
*Assistant Examiner*—Evan Pert
(74) *Attorney, Agent, or Firm*—Birch, Stewart, Kolasch & Birch, LLP

(57) ABSTRACT

A method for fabricating a semiconductor device including the steps of: forming a gate insulation film on the upper surface of a semiconductor substrate; forming a dummy layer pattern on the upper surface of the gate insulation film; forming an insulating side wall spacer on both side walls of the dummy layer pattern; injecting an impurity ion into the semiconductor substrate of the both sides of the side wall spacer, to form a source and a drain; forming an insulation layer in a manner that the entire upper surface of the semiconductor substrate becomes higher than the dummy layer pattern; performing a chemical-mechanical polishing step, to expose the upper surface of the dummy layer pattern; etching the dummy layer pattern and forming a trench on the gate insulation film; forming a barrier film on the inner wall of the trench and on the upper surface of the insulation layer; and filling the trench with copper layer.

6 Claims, 3 Drawing Sheets

METHOD FOR FABRICATING SEMICONDUCTOR DEVICE WITH COPPER GATE ELECTRODE

BACKGROUND OF THE INVENTION

1. Field of the Invention

The present invention relates to a semiconductor device, and more particularly, to a method for fabricating a semiconductor device suitable to a high speed and highly integrated device by lowering a resistance of a gate electrode.

2. Description of the Background Art

As a semiconductor device is highly integrated more and more, the length of a channel is rapidly shortened, which leads to a reduction in the width of a gate electrode. Accordingly, a polysilicon electrode typically used as a material for the gate electrode in the conventional art has a limitation in fabricating a high speed and highly integrated device.

Accordingly, the material for the existing gate electrode needs to be substituted by a fresh one having a low resistance.

Copper is spotlighted as a next generation metal line material since it has a low resistance and a favorable electron mobility characteristic. Nevertheless, due to its defective that it is hardly diffused into an insulation film, copper has never been used as a gate electrode.

Accordingly, the inventor of the present invention has studied in search for a method for fabricating a semiconductor device by using copper, having the low resistance and favorable electron mobility characteristic, as a gate electrode.

SUMMARY OF THE INVENTION

Therefore, an object of the present invention is to provide a method for fabricating a semiconductor device having a gate electrode suitable to a high speed and a highly integrated device.

Another object of the present invention is to provide a method for fabricating a semiconductor device of which a gate electrode is formed by using copper having a lower resistance and favorable electron mobility characteristic.

To achieve these and other advantages and in accordance with the purposed of the present invention, as embodied and broadly described herein, there is provided a method for fabricating a semiconductor device including the steps of: forming a gate insulation film on the upper surface of a semiconductor substrate; forming a dummy layer pattern on the upper surface of the gate insulation film; forming an insulating side wall spacer on both side walls of the dummy layer pattern; injecting an impurity ion into the semiconductor substrate of the both sides of the side wall spacer, to form a source and a drain; forming an insulation layer in a manner that the entire upper surface of the semiconductor substrate becomes higher than the dummy layer pattern; performing a chemical-mechanical polishing step, to expose the upper surface of the dummy layer pattern; etching the dummy layer pattern and forming a trench on the gate insulation film; forming a barrier film on the inner wall of the trench and on the upper surface of the insulation layer; and filling the trench with copper layer.

In order to achieve the above objects, the method for fabricating a semiconductor device further including a step of forming a polysilicon layer pattern between a gate insulation film and a dummy layer pattern.

In order to achieve the above objects, the method for fabricating a semiconductor device further including a step of forming a silicide layer on the upper surface of the source and the drain, after the step of forming the source and the drain.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
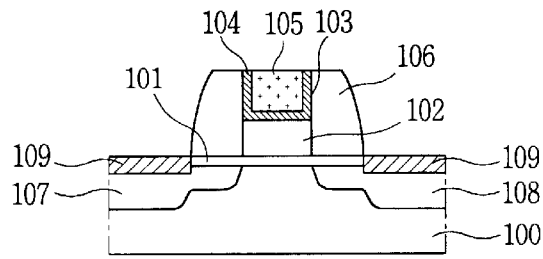
FIG. 1 is a vertical-sectional view showing a structure of a semiconductor device in accordance with the present invention.

FIG. 1 is a vertical-sectional view showing a structure of a semiconductor device in accordance with the present invention.

As shown in the drawing, a gate oxide film 101 is formed on the upper surface of a semiconductor substrate 100. A polysilicon layer 102 is formed on the upper surface of the gate oxide film 101. A barrier film 104 is formed on the upper surface of the polysilicon layer pattern 102, having a trench 103 at its center. The trench 103 surrounded by the barrier film 104 is filled with a copper layer 105.

At both sides of the barrier film 104, there is formed a side wall spacer 106 made of an insulation material.

A source 107 and a drain 108 are respectively formed within the semiconductor substrate 100 at both sides of the side wall spacer 106. A silicide layer 109 is formed on the upper surface of the source 107 and the drain 108.

A method for fabricating a semiconductor device of FIG. 1 is as follows.

Figure 2A:
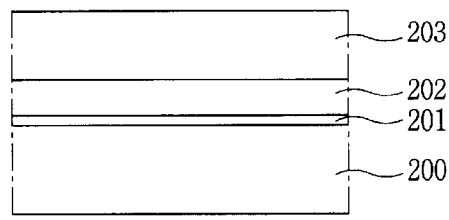
FIGS. 2A through 2H illustrate processes of a method for forming the semiconductor device in accordance with the present invention.

First, as shown in FIG. 2A, a gate insulation film 201 is formed on the upper surface of the semiconductor substrate 200.

Next, a polysilicon layer 202 and a dummy layer 203 are sequentially stacked on the upper surface of the gate insulation film 201. Since the dummy layer 203 is to be removed by etching, any film is available therefor, and any material is acceptable if it has a great etching selection ratio with a first insulation layer to be formed in the following process. In the present invention, a silicon oxide film ($SiO_2$) or a silicon nitride film ($SiN_x$) are used therefor.

Figure 2B:
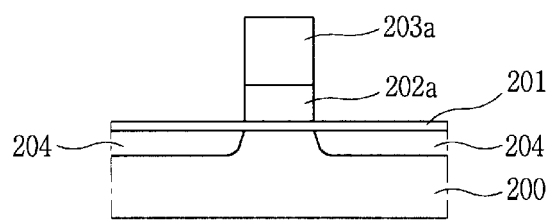

And, as shown in FIG. 2B, a photoresist mask (not shown) is formed on the upper surface of the dummy layer 203, and the dummy layer 203 and the polysilicon layer 202 are selectively etched by using a photoresist mask, thereby forming a dummy layer pattern 203a and a polysilicon layer pattern 202a.

And then, an impurity ion is injected in to the semiconductor substrate 200 at both sides of the dummy layer pattern 203a, to form a lightly doped drain (LDD).

Figure 2C:
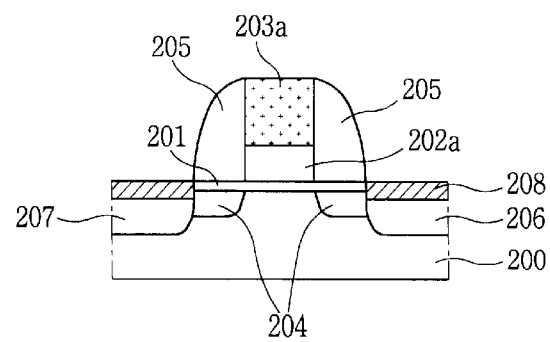

Thereafter, as shown in FIG. 2C, a first insulation layer is formed the entire surface of the structure as obtained of FIG.

2B and an anisotropic etching is wholly performed thereon without mask pattern, thereby forming a side wall spacer 205 at the side wall of the dummy layer pattern 203a and of the polysilicon layer pattern 202a.

Then, an impurity ion is injected into the semiconductor substrate 200 by using the side wall spacer 205 and the dummy layer pattern 203a as masks, thereby forming a source 206 and a drain 207.

And then, a metal film is formed on the entire upper surface of the semiconductor substrate 200, and a silicide process is performed thereon, to form a metal silicide layer 208 such as titanium, tantalum, tungsten or a cobalt on the upper surface of the source 206 and the drain 207.

Figure 2D:
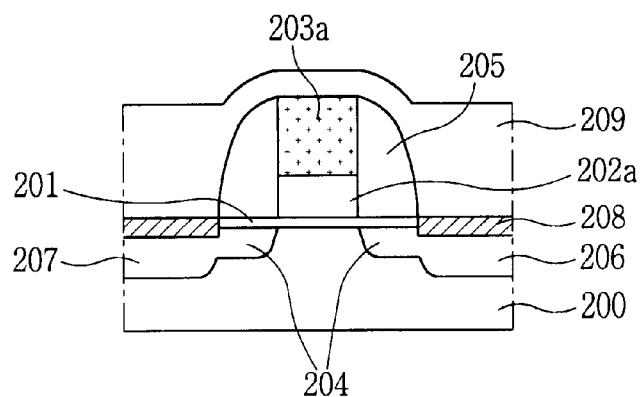

Next, as shown in FIG. 2D, a second insulation layer 209 is formed on the entire surface of the structure as obtained of FIG. 2C.

Figure 2E:
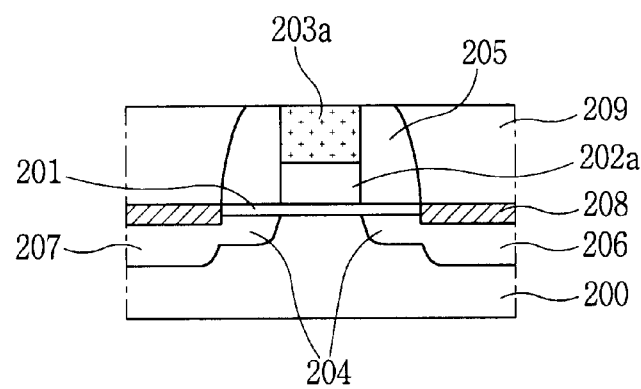

And, as shown in FIG. 2E, a chemical-mechanical polishing step is performing for the second insulation layer 209 until the upper surface of the dummy layer pattern 203a is exposed.

Figure 2F:
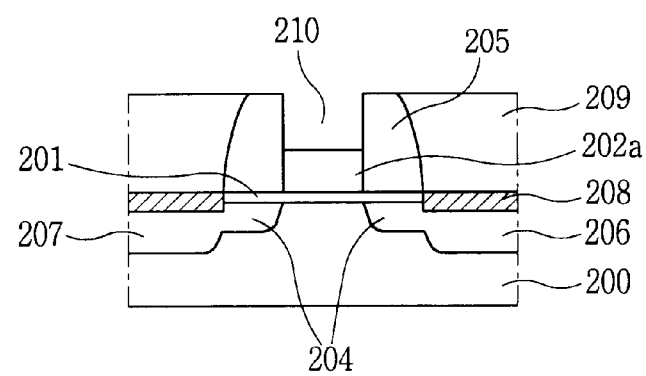

And then, as shown in FIG. 2F, the dummy layer pattern 203a is selectively etched for removing, to thereby form a trench 210.

Figure 2G:
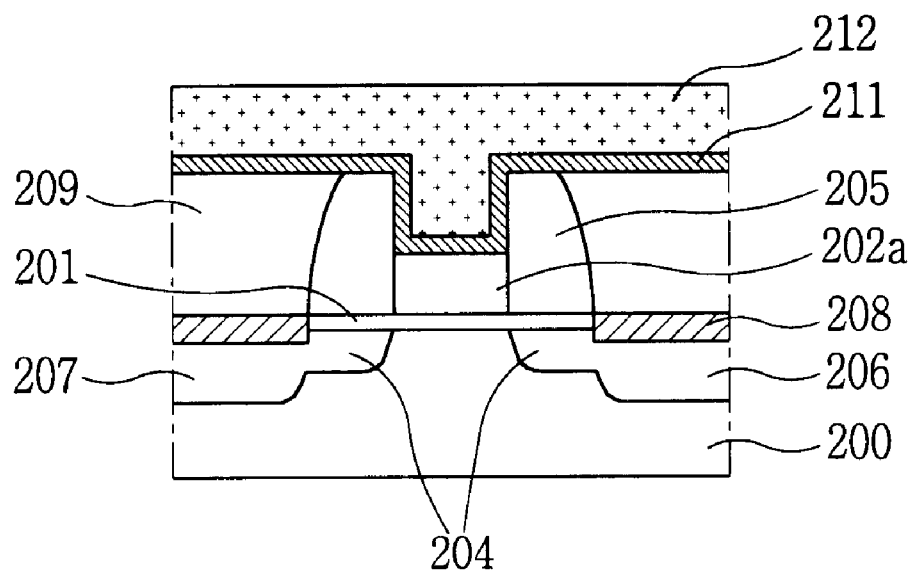

Thereafter, as shown in FIG. 2G, a metal film 211 is formed on the entire surface of the obtained structure of FIG. 2F, that is on the bottom surface and side wall of the trench 210 and on the upper surface of the second insulation layer 209. As a material for the barrier metal film 211, one of WNx, TiN or TaN is preferably selected.

And, a copper layer 212 is formed on the entire surface of the barrier metal film 211, filling the trench 210. The copper layer 212 is formed by a physical deposition method, chemical vapor deposition method or an electroplating method.

Figure 2H:
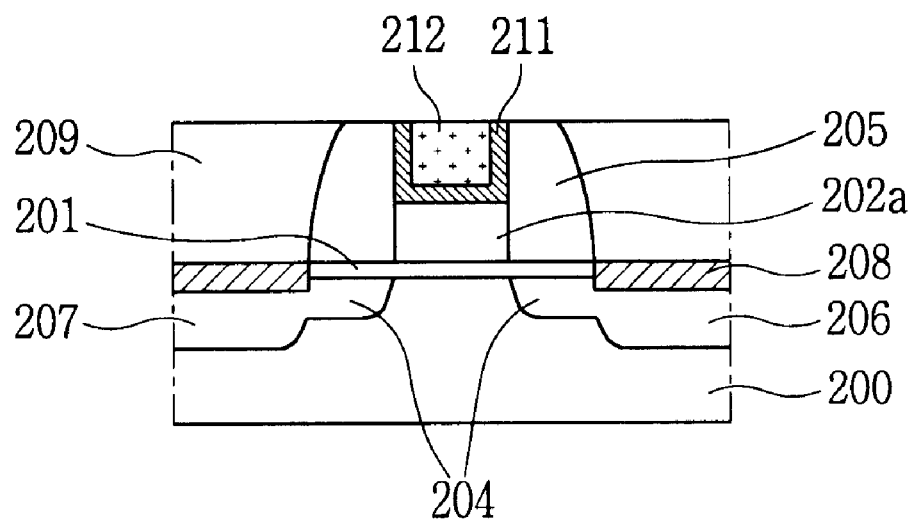

Next, as shown in FIG. 2H, the chemical-mechanical polishing step is performed for the copper layer 212 until the upper surface of the second insulation layer is exposed with the copper layer 212 remaining inside the trench 210, thereby forming the gate electrode and completing the fabrication of the semiconductor device. The copper layer 212 of the present invention may be substituted with aluminum (Al), tungsten (W), cobalt (Co), nickel (Ni), platinum (Pt) or gold (Ag).

As so far described, the method for fabricating a semiconductor device of the present invention utilizes copper which has been notably disadvantageous in a view that ion is easily diffused into the insulation film, making it impossible to be used as a material for the gate electrode, in spite of its advantages of low resistance and favorable electron mobility characteristic. By adopting the method of the fabricating a semiconductor device, a semiconductor device operable at a high speed can be fabricating.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for fabricating a semiconductor device comprising the steps of: forming a gate insulating film on the upper surface of a semiconductor substrate;

forming a dummy layer pattern on the upper surface of the gate insulation film;

forming an insulating side wall spacer on both side walls of the dummy layer pattern;

injecting an impurity ion into the semiconductor substrate of the both sides of the side wall spacer, to form a source and a drain;

forming an insulation layer in a manner that the entire upper surface of the semiconductor substrate becomes higher than the dummy layer pattern;

performing a chemical-mechanical polishing step, to expose the upper surface of the dummy layer pattern;

etching the dummy layer pattern and forming a trench on the gate insulation film;

forming a single layer metallic barrier film on the inner wall of the trench adjacent to the side wall spacers and on the upper surface of the insulation layer; and filling the trench with a copper layer.

2. The method according to claim 1, further include a step of forming a polysilicon layer pattern between a gate insulation film and a dummy layer pattern.

3. The method according to claim 1, wherein the dummy layer pattern is one of silicon oxide film $SiO_2$ or a silicon nitride film ($SiN_x$).

4. The method according to claim 1, wherein the barrier film is made of one of WNx, TiN or TaN.

5. The method according to claim 1, further including a step of forming a silicide layer on the upper surface of the source and the drain, after the step of forming the source and the drain.

6. The method according to claim 1, wherein a lightly doped drain region is formed in the semiconductor substrate at both sides of the dummy layer pattern, after the step of forming the dummy layer pattern.

* * * * *